United States Patent
Lee et al.

(10) Patent No.: US 10,192,799 B2
(45) Date of Patent: Jan. 29, 2019

(54) METHOD AND APPARATUS TO MODEL AND MONITOR TIME DEPENDENT DIELECTRIC BREAKDOWN IN MULTI-FIELD PLATE GALLIUM NITRIDE DEVICES

(71) Applicant: Texas Instruments Incorporated, Dallas, TX (US)

(72) Inventors: Dong Seup Lee, McKinney, TX (US); Jungwoo Joh, Allen, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/010,654

(22) Filed: Jun. 18, 2018

(65) Prior Publication Data

US 2018/0308773 A1     Oct. 25, 2018

Related U.S. Application Data

(62) Division of application No. 15/439,191, filed on Feb. 22, 2017, now Pat. No. 10,014,231.

(Continued)

(51) Int. Cl.

| | |
|---|---|
| *G01R 31/28* | (2006.01) |
| *G01R 31/12* | (2006.01) |
| *H01L 27/08* | (2006.01) |
| *H01L 29/41* | (2006.01) |
| *H01L 29/20* | (2006.01) |
| *H01L 29/40* | (2006.01) |
| *H01L 29/06* | (2006.01) |
| *H01L 21/66* | (2006.01) |
| *H01L 27/088* | (2006.01) |

(Continued)

(52) U.S. Cl.
CPC .............. *H01L 22/34* (2013.01); *G01R 31/12* (2013.01); *G01R 31/2884* (2013.01); *H01L 23/544* (2013.01); *H01L 27/088* (2013.01); *H01L 29/0649* (2013.01); *H01L 29/2003* (2013.01); *H01L 29/404* (2013.01); *H01L 29/41725* (2013.01)

(58) Field of Classification Search
CPC . H01L 22/34; H01L 23/544; H01L 29/41725; H01L 29/2003; H01L 29/0649; H01L 27/088; H01L 29/404; G01R 31/12; G01R 31/2884
USPC ......................................................... 257/48
See application file for complete search history.

(56) References Cited

U.S. PATENT DOCUMENTS

| | | |
|---|---|---|
| 2009/0090984 A1 | 4/2009 | Khan et al. |
| 2010/0253380 A1 | 10/2010 | Martin et al. |

*Primary Examiner* — Caleen Sullivan
(74) *Attorney, Agent, or Firm* — Jacqueline J. Garner; Charles A. Brill; Frank D. Cimino

(57) ABSTRACT

A first set of test structures for a gallium nitride (GaN) transistor that includes N field plates is disclosed, where N is an integer and X is an integer between 0 and N inclusive. A test structure $TS_X$ of the first set of test structures includes a GaN substrate, a dielectric material overlying the GaN substrate, a respective source contact abutting the GaN substrate and a respective drain contact abutting the GaN substrate. The test structure $TS_X$ also includes a respective gate overlying the substrate and lying between the respective source contact and the respective drain contact and X respective field plates corresponding to X of the N field plates of the GaN transistor, the X respective field plates including field plates that are nearest to the GaN substrate.

20 Claims, 9 Drawing Sheets

FIG. 3B

Related U.S. Application Data

(60) Provisional application No. 62/440,049, filed on Dec. 29, 2016.

(51) Int. Cl.
*H01L 29/417* (2006.01)
*H01L 23/544* (2006.01)

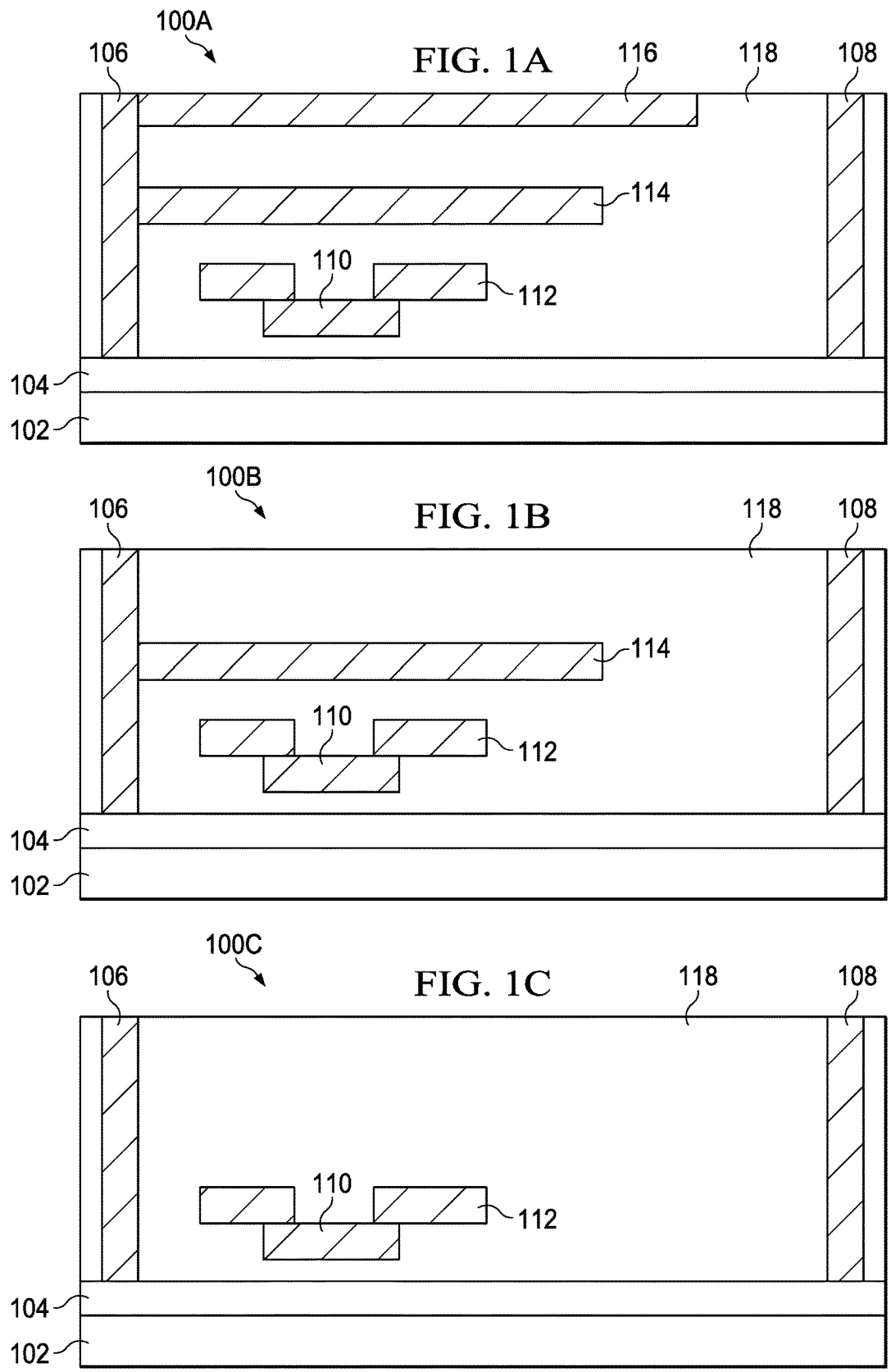

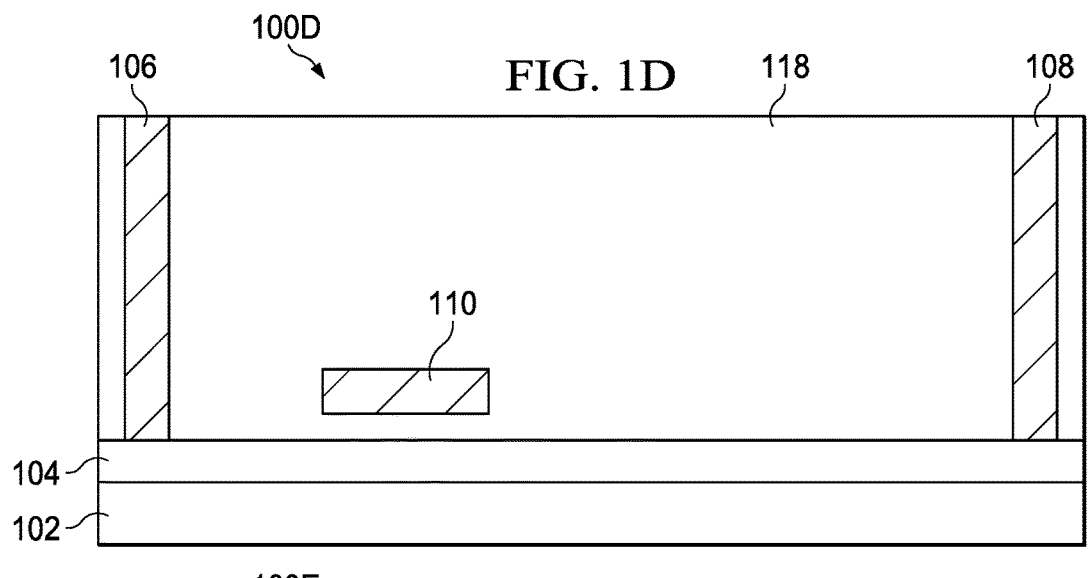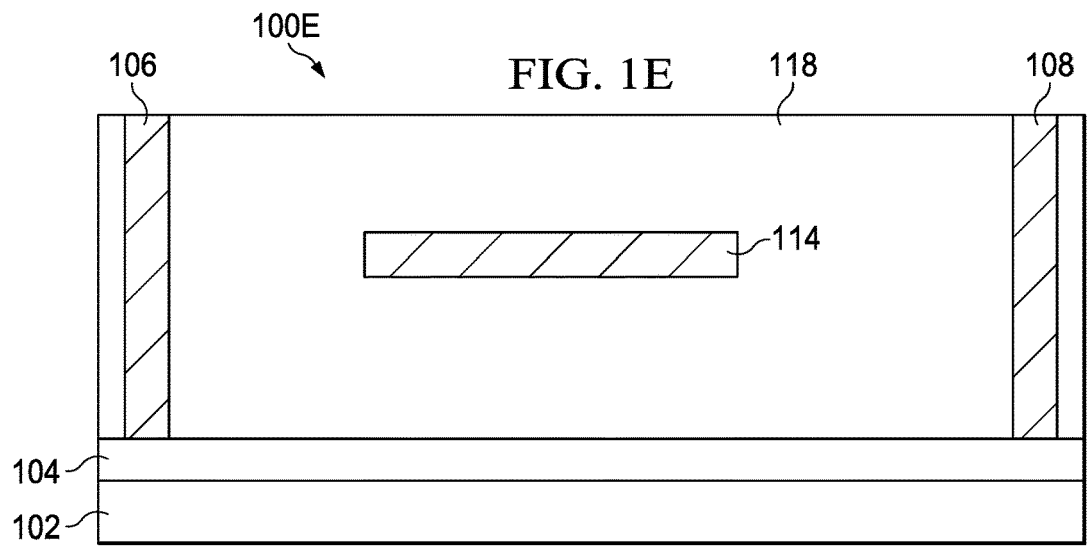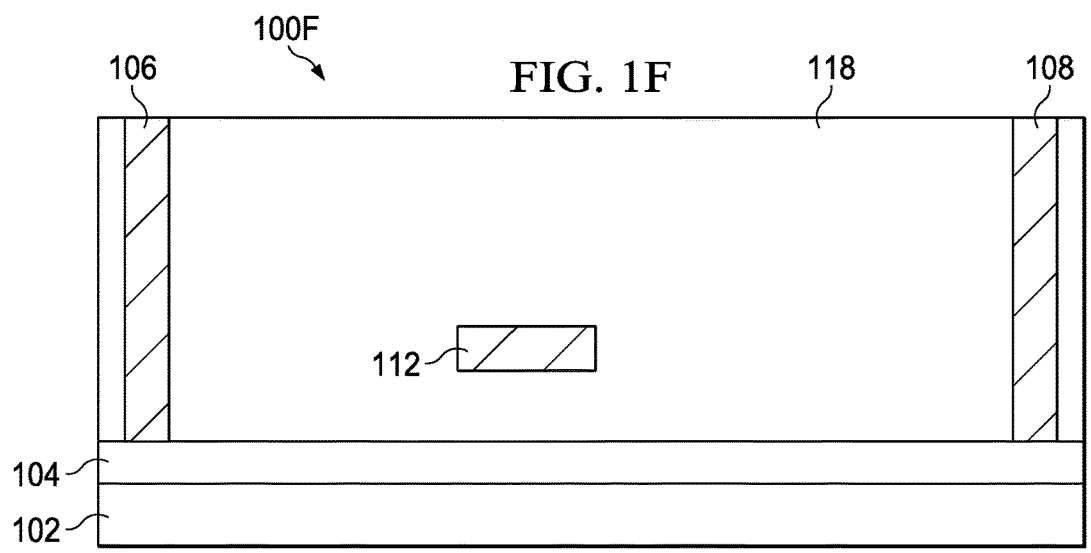

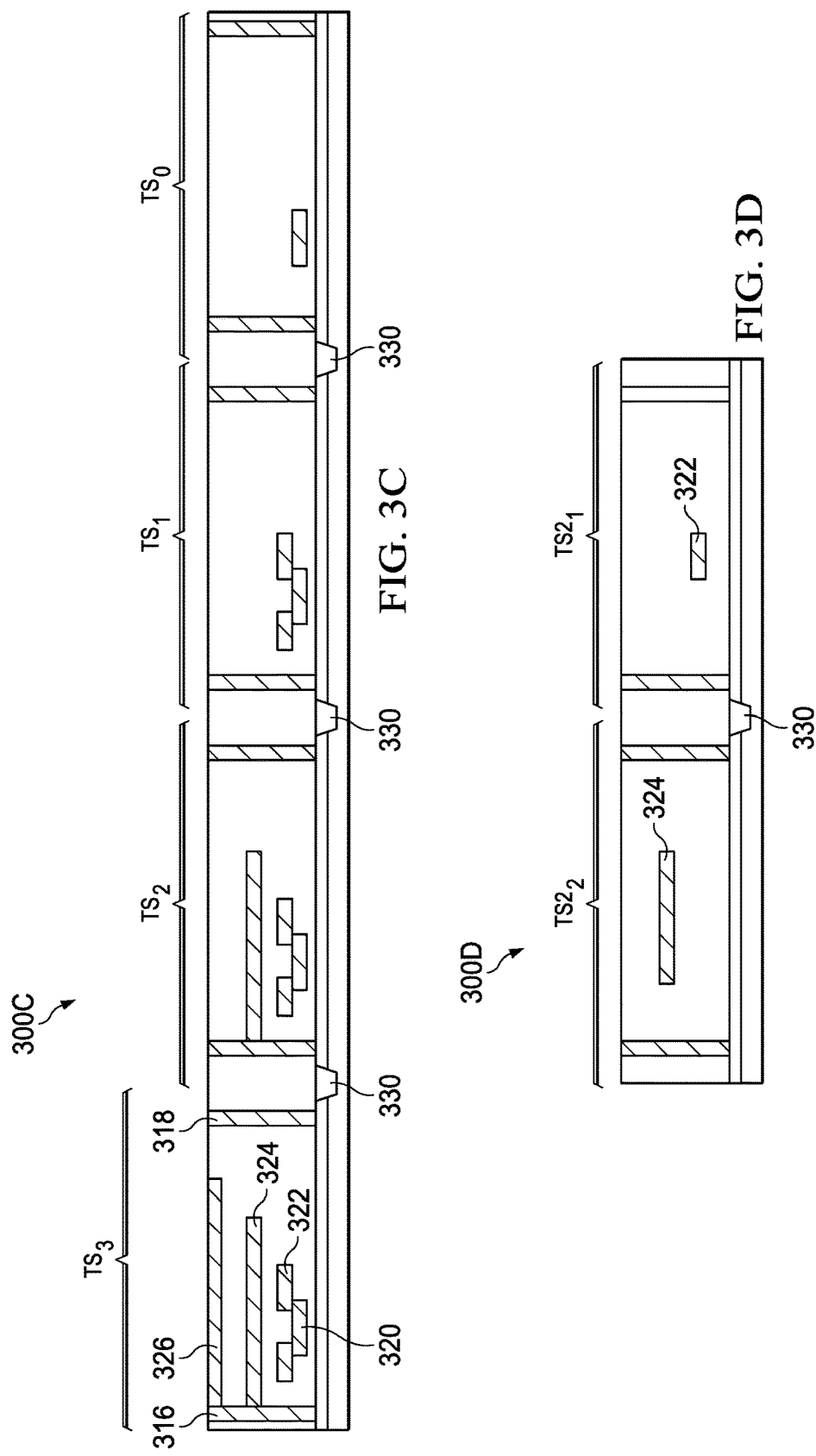

METHOD AND APPARATUS TO MODEL AND MONITOR TIME DEPENDENT DIELECTRIC BREAKDOWN IN MULTI-FIELD PLATE GALLIUM NITRIDE DEVICES

CROSS REFERENCE TO RELATED APPLICATIONS

This application is a divisional of U.S. patent application Ser. No. 15/439,191, filed Feb. 22, 2017, which claims the benefit of U.S. Provisional patent application Ser. No. 62/440,049, filed Dec. 29, 2016, the contents of both of which are herein incorporated by reference in its entirety.

FIELD OF THE DISCLOSURE

Disclosed embodiments relate generally to the field of testing integrated circuit devices. More particularly, and not by way of any limitation, the present disclosure is directed to a method and apparatus to model and monitor time dependent dielectric breakdown in multi-field plate gallium nitride (GaN) devices.

BACKGROUND

Unlike semiconductor processing on silicon-based wafers, which has been studied and refined for more than half a century, gallium nitride processing is a relatively new technology, for which standardized testing is still being devised. In particular, in GaN high voltage technology, no standard qualification criteria have yet been determined. Processes are needed that can validate GaN and similar devices for long term use in a relatively short amount of time.

Due to the high critical electric field of GaN, Time Dependent Dielectric Breakdown (TDDB) can be one of the main factors that limit the device lifetime. Most GaN high voltage devices utilize a structure that includes multiple field plates to shield underlying structures from the high voltages present. However, the presence of multiple field plates increases the challenge in determining the TDDB lifetime of the inner field plate region due to the electric field shielding from the outer field plates.

SUMMARY

Disclosed embodiments provide a first and a second set of test structures and a method of using these test structures to test and monitor variations in design and processing that can affect the TDDB lifetime of a GaN device or other device utilizing multiple field plates. The first set of test structures includes a separate test structure for each level of field plate and another separate structure for the gate. The test structure designed to test a particular field plate or gate eliminates the overlying field plate(s) that can shield the tested structure. For example, a test structure for the gate includes only the source contact, the drain contact and the gate, with no field plates, allowing the gate to be separately qualified; a test structure for the first field plate (which for the purposes of this application are numbered sequentially from the field plate closest to the substrate outward) includes the source contact, the drain contact, the gate and the first field plate; a test structure for the second field plate includes the source contact, the drain contact, the gate, the first field plate and the second field plate; etc. The second set of test structures focuses on the inner field plates. In this second set of test structures, only the source and drain contacts and the inner field plate under test are provided in the respective test structure.

Testing includes subjecting each of the first test structures to high voltages on the drain contact, i.e., higher than the normal operating voltages to which the specific structure-under-test will be exposed, and determining the mean time to failure (MTTF) of the device under each of the subject voltages. Testing can also include determining a time to failure distribution in order to build a reliability model. The values determined for the MTTF can then be projected for normal operating conditions. If the projected MTTF is acceptable, testing is completed; otherwise changes can be proposed for the device structure and retested. Once testing has been completed and the design and processing are finalized, the disclosed test structures can be incorporated into scribe structures on the production chip. This provides a mechanism by which production can be monitored on a periodic basis, by probing the scribe structures to ensure that processing has not drifted away from specifications.

The second set of test structures is useful when one or more of the inner field plates fails earlier than the outer field plates for any reason. This set provides the simplest structure that can be used to test a particular field plate without having to worry about the reliability of other field plates. Testing on the second set of test structures can take two forms. In a three-terminal mode, a voltage is applied to the field plate that is less than the threshold voltage for the field plate to pinch off the channel. At the same time, the source is held at the lower rail and a test voltage is applied to the drain until failure. In a two-terminal mode, the source contact is either floating or not connected, while the test voltage is applied to the drain contact until the field plate fails.

In one aspect, an embodiment of a first set of (N+1) test structures for a gallium nitride (GaN) transistor that comprises N field plates is disclosed, N being an integer and X being an integer between 0 and N inclusive. A test structure $TS_X$ includes a GaN substrate; a dielectric material overlying the GaN substrate; a respective source contact abutting the GaN substrate; a respective drain contact abutting the GaN substrate; a respective gate overlying the substrate and lying between the respective source contact and the respective drain contact; and X respective field plates corresponding to X of the N field plates of the GaN transistor, the X field plates comprising field plates that are nearest to the GaN substrate.

In another aspect, an embodiment of a test method is disclosed. The test method includes providing a first set of test structures $TS_0$ through $TS_N$ for a gallium nitride (GaN) transistor that comprises N field plates, N being an integer and X being an integer between 0 and N inclusive, a test structure $TS_X$ of the first set of test structures comprising: a GaN substrate, a dielectric material overlying the GaN substrate, a respective source contact abutting the GaN substrate, a respective drain contact abutting the GaN substrate, a respective gate overlying the substrate and lying between the respective source contact and the respective drain contact, X field plates corresponding to X field plates of the N field plates of the GaN transistor that are nearest to the GaN substrate, and a respective input/output pad coupled to each of the respective source contact, the respective drain contact and the respective gate; for each test structure $TS_X$, the test method comprising: applying a stress voltage to the respective drain contact of $TS_X$ until a dielectric breakdown condition is detected; and recording the time-to-failure of $TS_X$ at the stress voltage.

In yet another aspect, an embodiment of an integrated circuit (IC) chip is disclosed. The IC chip includes a substrate comprising gallium nitride (GaN); a dielectric material overlying the substrate; a transistor formed in an active circuitry region of the IC chip, the transistor comprising a first gate overlying the substrate, a first source contact abutting the substrate, a first drain contact abutting the substrate and N field plates overlying the gate, N being an integer; and a scribe structure formed outside the active circuitry region of the IC chip, the scribe structure comprising a set of (N+1) first test structures for the transistor, a test structure $TS_X$ of the first set of test structures comprising: a respective source contact abutting the GaN substrate, a respective drain contact abutting the GaN substrate, a respective gate overlying the substrate and lying between the respective source contact and the respective drain contact, X field plates, X being an integer between 0 and N inclusive, the X field plates corresponding to X field plates of the N field plates of the transistor that are nearest to the substrate, and a respective isolation barrier separating test structure $TS_X$ from adjacent test structures.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 1A-1F depict individual test structures of a set of test structures for a GaN device having multiple field plates according to an embodiment of the disclosure;

FIGS. 3C and 3D depict cross sections through an example scribe structures that includes the disclosed set of test structures according to an embodiment of the disclosure;

DETAILED DESCRIPTION OF THE DRAWINGS

Figure 2:
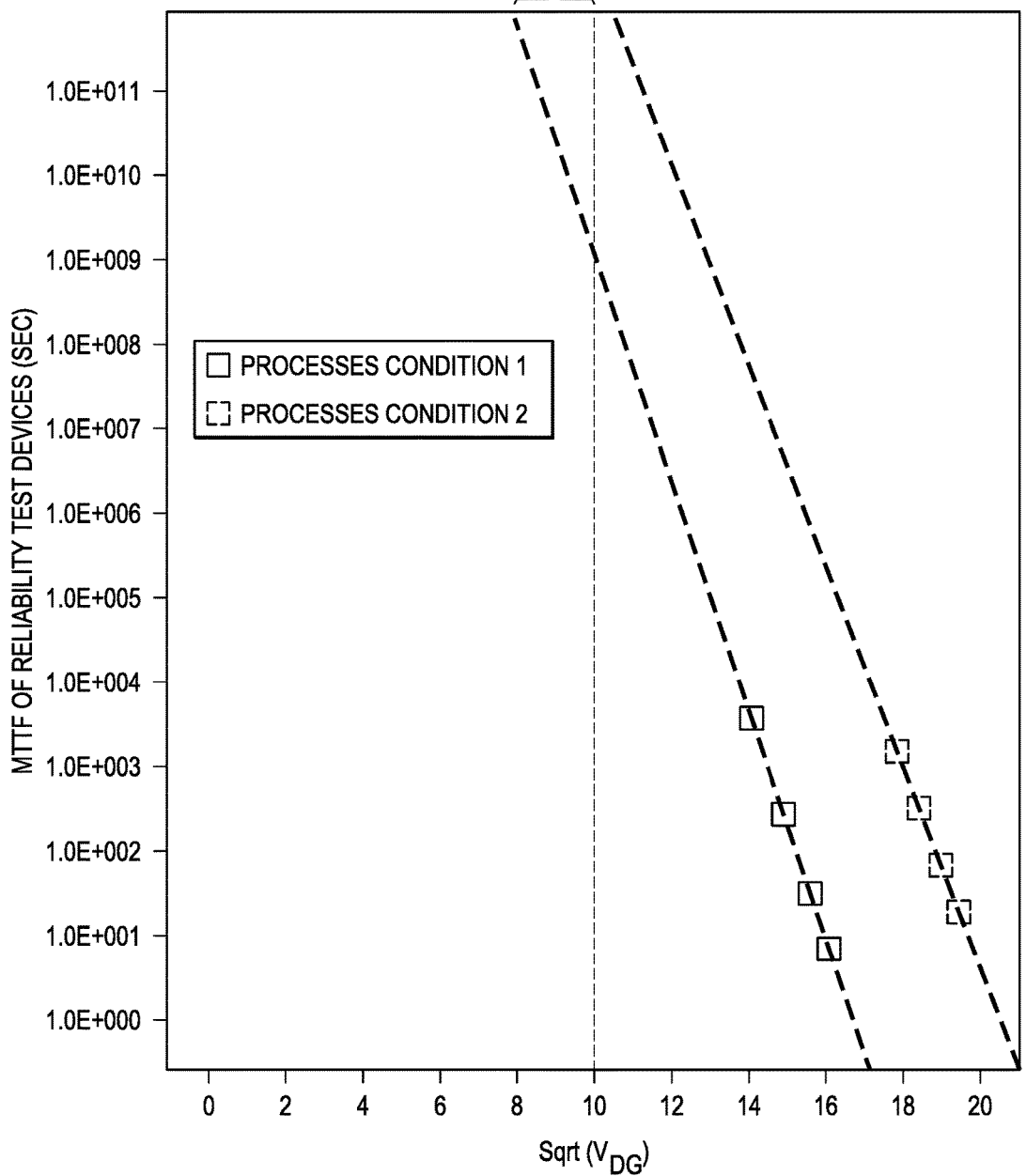
FIG. 2 depicts test data collected to determine mean time to failure for the innermost field plate using two different process conditions according to an embodiment of the disclosure.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A typical GaN transistor includes a thin layer of aluminum gallium nitride (AlGaN) located above a GaN layer. Because the AlGaN and GaN layers exhibit different bandgaps, they are said to meet at a heterojunction. Under proper conditions, a two-dimensional electron gas (2-DEG) is formed at this heterojunction interface of the GaN and AlGaN layers. In the 2-DEG, some electrons are unbound to atoms and free to move, providing higher mobility as compared with other types of transistors. Accordingly, little or no doping of the substrate is required for operation of the GaN transistor.

FIG. 1A represents a cross-section of both an example GaN device and a first test structure 100A for the GaN device according to an embodiment of the disclosure. The GaN device in this example embodiment is a power transistor designed for high voltages, e.g., 600 volts. However, the teachings presented herein are equally applicable to other semiconductor devices and is not limited to the particular devices described below. Test structure 100A includes a substrate 102 and an epitaxial layer 104 formed on the upper surface of substrate 102. In one embodiment, substrate 102 comprises gallium nitride and epitaxial layer 104 comprises aluminum gallium nitride. In other embodiments, two active layers, such as a GaN layer and an AlGaN layer, are formed on a substrate comprising, e.g., silicon, silicon carbide, sapphire, or other semiconductor material.

Although the discussion that follows is directed primarily to embodiments based on GaN, it will be understood that the disclosed apparatus and method are not so limited. In one embodiment, the test structures contain nitride compounds of elements from Group III of the Periodic Table of Elements. In one embodiment, the active layers have the formula $B_wAl_xIn_yGa_zN$, in which w, x, y and z each has a suitable value between zero and one (inclusive). The reference herein to $B_wAl_xIn_yGa_zN$ or a $B_wAl_xIn_yGa_zN$ material refers to a semiconductor material having nitride and one or more of boron, aluminum, indium and gallium. Examples of $B_wAl_xIn_yGa_zN$ materials include GaN, AlN, AlGaN, AlInGaN, InGaN, and BAlInGaN, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant such as silicon and germanium.

A source contact 106, drain contact 108 and gate 110, which can be formed of conductive material such as titanium, nickel, aluminum, gold and ohmic metals, complete the basic elements of the transistor. Source contact 106 and drain contact 108 both abut the substrate. In one embodiment (not specifically shown), gate 110 also abuts the substrate, e.g. with a p-type GaN substrate in an enhancement mode transistor. In one embodiment shown in FIG. 1A, a gate dielectric separates gate 110 from substrate 102. Given the need to place gate 110 near or touching epitaxial layer 104, which causes the dielectric layer under gate 110 to be relatively thin, gate 110 is not able to withstand the electric field generated by the large gate/drain voltages that exist during operation of the GaN transistor 100A. To protect gate 110 from these high voltages, one or more field plates 112, 114, 116, which are also formed of a conductive material, are used to reduce the electric field produced by the high voltage. As seen in this embodiment, field plate 112 is coupled to gate 110, so that these two structures share the same voltage, but field plate 112 extends laterally closer to drain contact 108 that does gate 110. Field plate 114 is coupled to source contact 106, lies above both gate 110 and field plate 112 and extends laterally closer to drain contact 108 than the two lower elements. Field plate 116 is also coupled to source contact 106, lies above field plate 114 and extends laterally closer to drain contact 108 than field plate 114. In one embodiment, not specifically shown, each of field plates 112, 114, 116 are coupled to gate 110. In one embodiment, also not specifically shown, field plates 112, 114 are coupled to gate 110 and field plate 116 is coupled to the source. In one example, for a GaN device that is subjected to 600 volts at the gate, field plate 116 shields gate 110 and field plates 112, 114 from approximately 200 volts; field plate 114 shields both gate 110 and field plate 112 from an additional 200 volts and field plate 112 shields gate 110 from a final 200 volts. A dielectric material 118, which can be silicon oxide, silicon nitride, or other dielectric material, fills the spaces between the conductive elements and insulates the various elements. It will be understood that although dielectric material 118 is shown as a monolithic material, dielectric material 118 is generally laid down in various layers as different metallization layers are formed. It will further be understood that the specific materials used to form the GaN device are not relevant to the disclosed test structures and method of testing, but are given solely as examples. Additionally, although three field plates are shown in FIG. 1A, a GaN device can have either more or fewer field plates, depending on the voltages used, the materials, and the specific needs of the device.

As noted previously, one of the most common failures seen in testing device 100A is time dependent dielectric breakdown. One of the specifications that the Joint Electronic Device Engineering Council (JEDEC) has provided for silicon is operation for 1000 hours at 150° C. However, in testing the longevity of GaN device 100A, examples of TDDB have occurred at 2000 hours, e.g., at a corner of the gate 110 or field plate 112. Such failures illustrate the need for a testing methodology for the GaN device that can be performed quickly, e.g., in less than an hour, to certify that all levels of the GaN device can provide a desired lifetime, typically ten years. However, given the shielding action of the field plates 112, 114, 116, testing the reliability of device 100A as a whole will generally indicate only the reliability of outer field plate 116 and will not test the reliability of the underlying structures separately.

In order to test each element of transistor 100A, a first suite or set of additional test structures is provided, as shown in FIGS. 1B-1D. For example, because test structure 100B in FIG. 1B does not include field plate 116, test structure 100B can be utilized to test the reliability of field plate 114. Similarly, test structure 100C in FIG. 1C, which does not include either of field plates 114, 116, can be utilized to test the reliability of field plate 112; and test structure 100D in FIG. 1D, which does not include any field plates 112, 114, 116, can be utilized to test the reliability of gate 110. A second set of test structures can also be provided to test the inner field plates in an even more simplified structure, as shown in FIGS. 1E-1F. For the example transistor having three field plates 112, 114, 116, a further test structure for each of the inner field plates includes only the field plate under test, the source contact and the drain contact. Test structure 100E in FIG. 1E includes only source contact 106, drain contact 108 and field plate 114, with field plate 114 acting as a gate. Test structure 100F in FIG. 1F includes only source contact 106, drain contact 108 and field plate 112, with field plate 112 acting as a gate. When these test structures are subjected to high voltages, the remaining field plate acts as the gate in the structure.

Once all of the test structures, e.g., test structures 100A-100F, are fabricated using desired process conditions, testing can be performed. The testing is designed to accelerate failure of the element being tested, either a field plate or gate. In one embodiment, during the testing, source contact 106 is grounded and the voltage on gate 110 is held below the threshold voltage $V_{TH}$ to ensure that the transistor is turned off. A high drain voltage is then applied to accelerate the electron-field between gate 110 and drain contact 108. The specific voltage applied during testing is dependent on the specific test structures and the voltage acceleration factor. In one embodiment, the applied voltage is three to six times the normal operating voltage to which the structure-under-test is usually subjected. This bias condition is held, while the gate-to-drain leakage is monitored. When the device fails due to dielectric breakdown, the leakage current increases abruptly; the time-to-failure is then noted as the time under stress up to the point of failure. FIG. 2 discloses a graph that plots the square root of the gate/drain voltage ($V_{DG}$) against a logarithmic scale of time in seconds. When plotted in this manner, the mean time to failure, as determined at various voltages, tends to respond linearly and can be projected to lower voltages to provide an estimated lifetime at normal operating voltages. As seen in graph 200, a first process condition can be predicted to provide a lifetime of $1 \times 10^9$ seconds under normal conditions or a bit over thirty years. A second process condition can be predicted to provide a lifetime greater than $1 \times 10^{11}$ seconds, or over a hundred percent increase in predicted lifetime. This test is, of course, only testing one level of the device; however, if all levels test as having a lifetime at or above the desired range, the device as a whole can be verified for the desired lifetime.

Figure 3A:
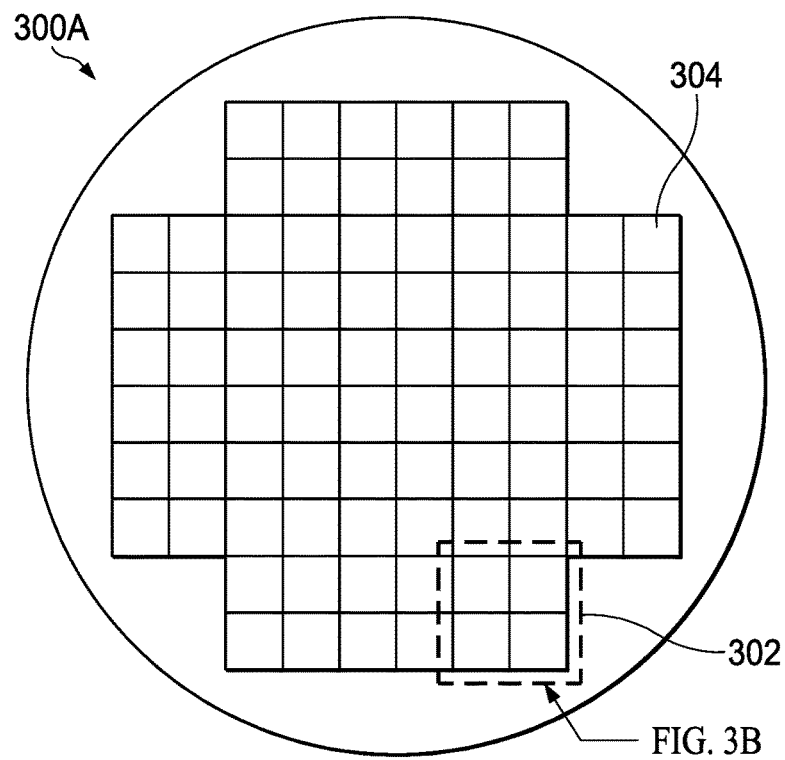
FIG. 3A depicts an overhead view of an example semiconductor wafer that includes a number of dies on which are formed GaN circuits according to an embodiment of the disclosure.
Figure 3B:
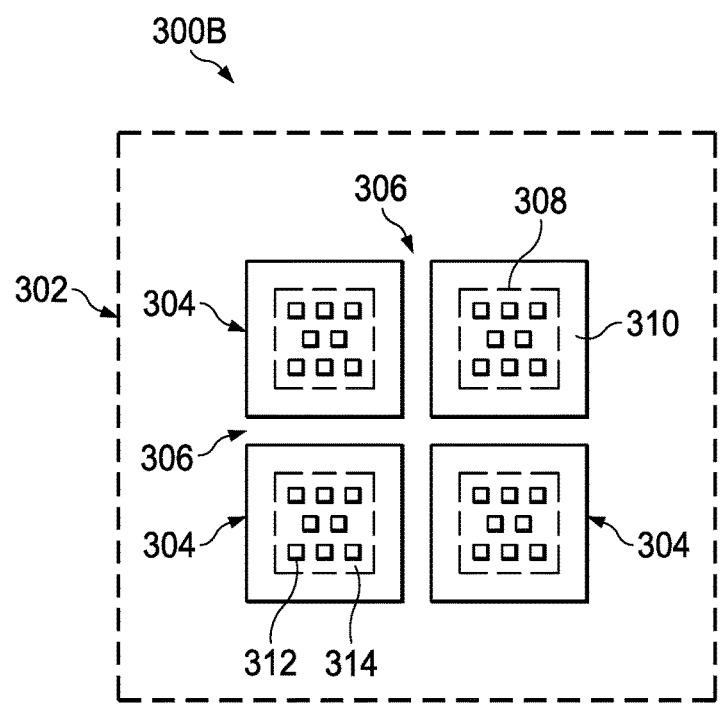
FIG. 3B depicts an enlargement of a portion of the wafer of FIG. 3A.
Figure 4A:
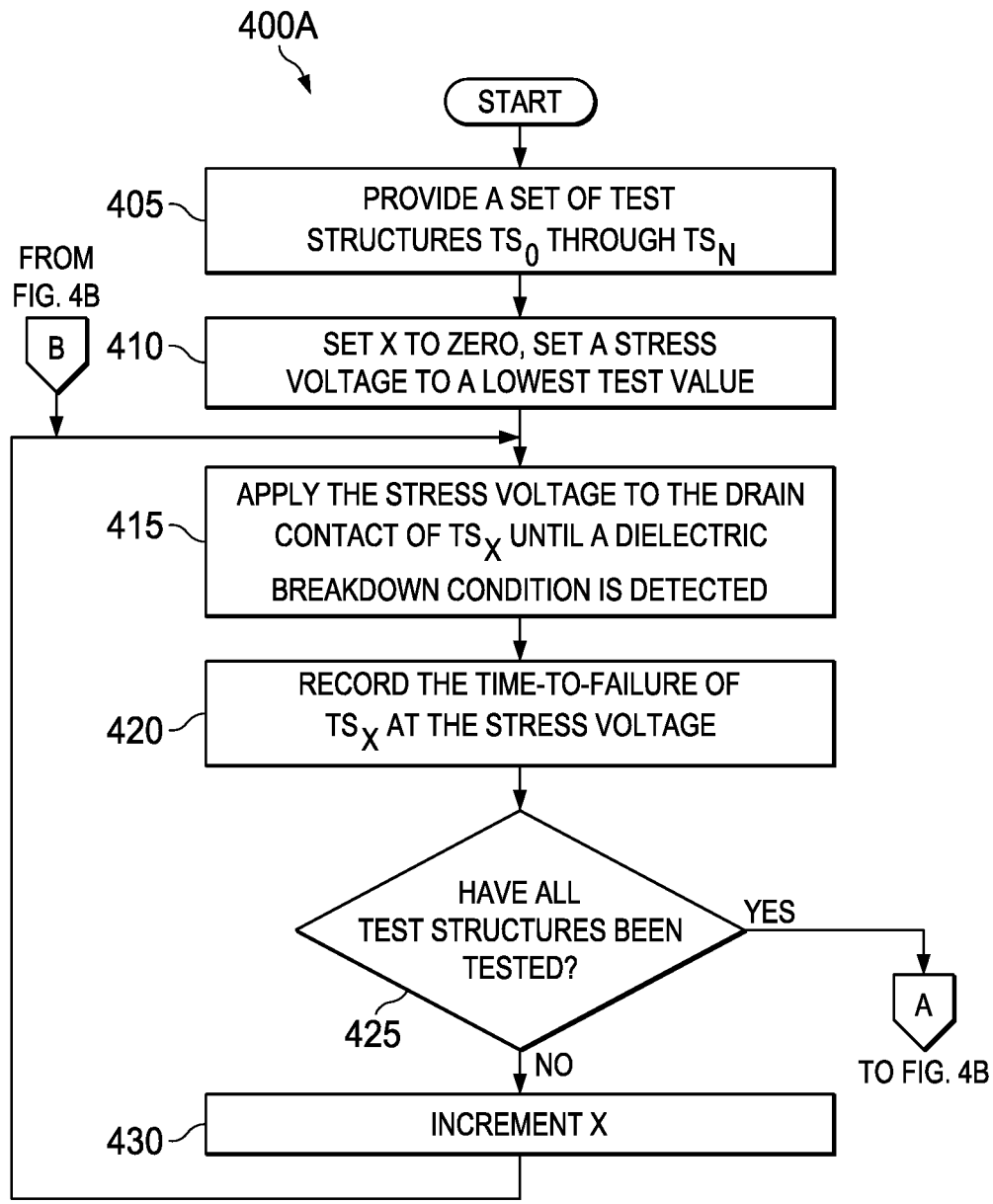
FIGS. 4A and 4B depict a method of testing a GaN or semiconductor device having multiple field plates according to an embodiment of the disclosure.
Figure 4B:
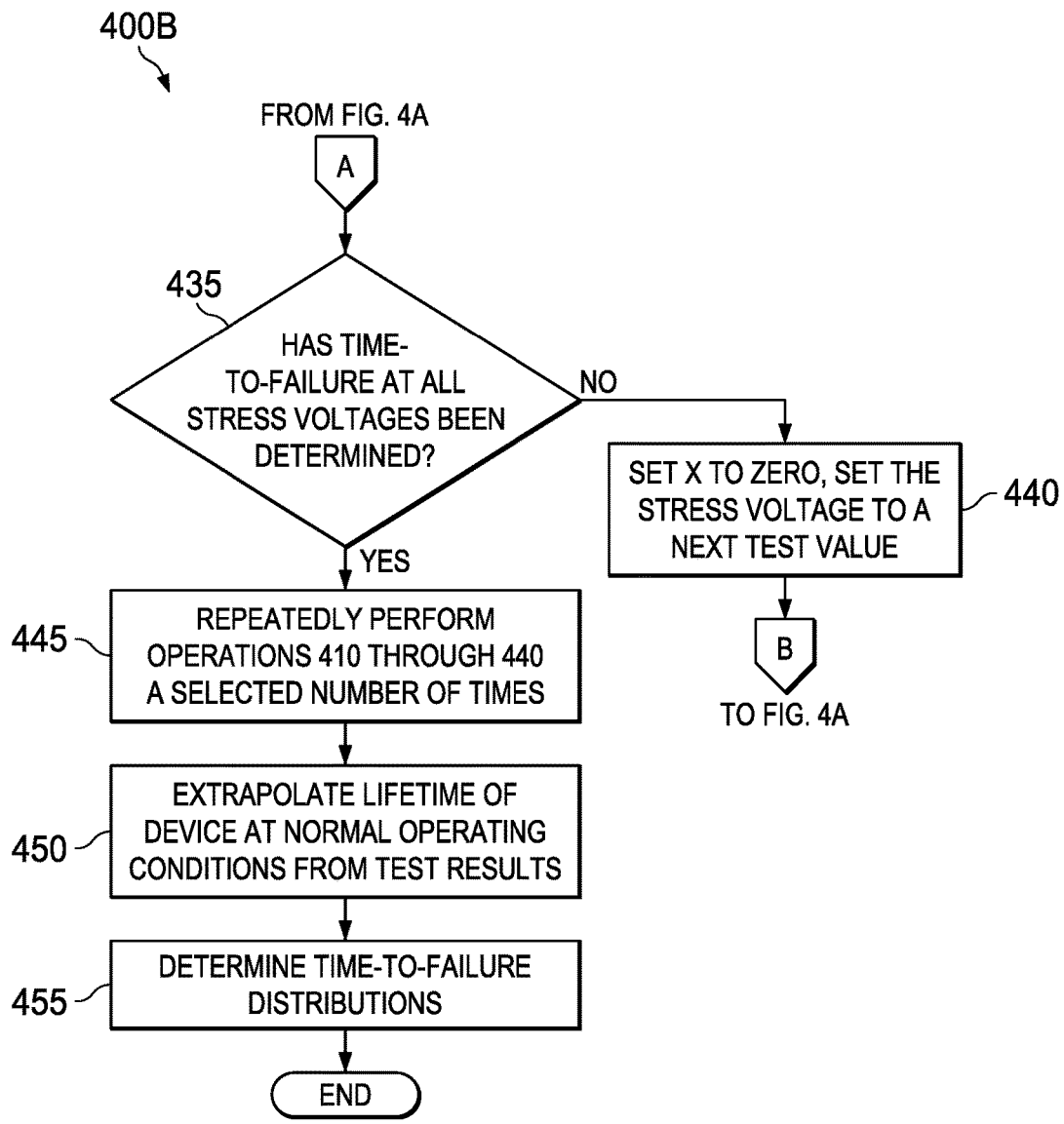
Figure 4C:
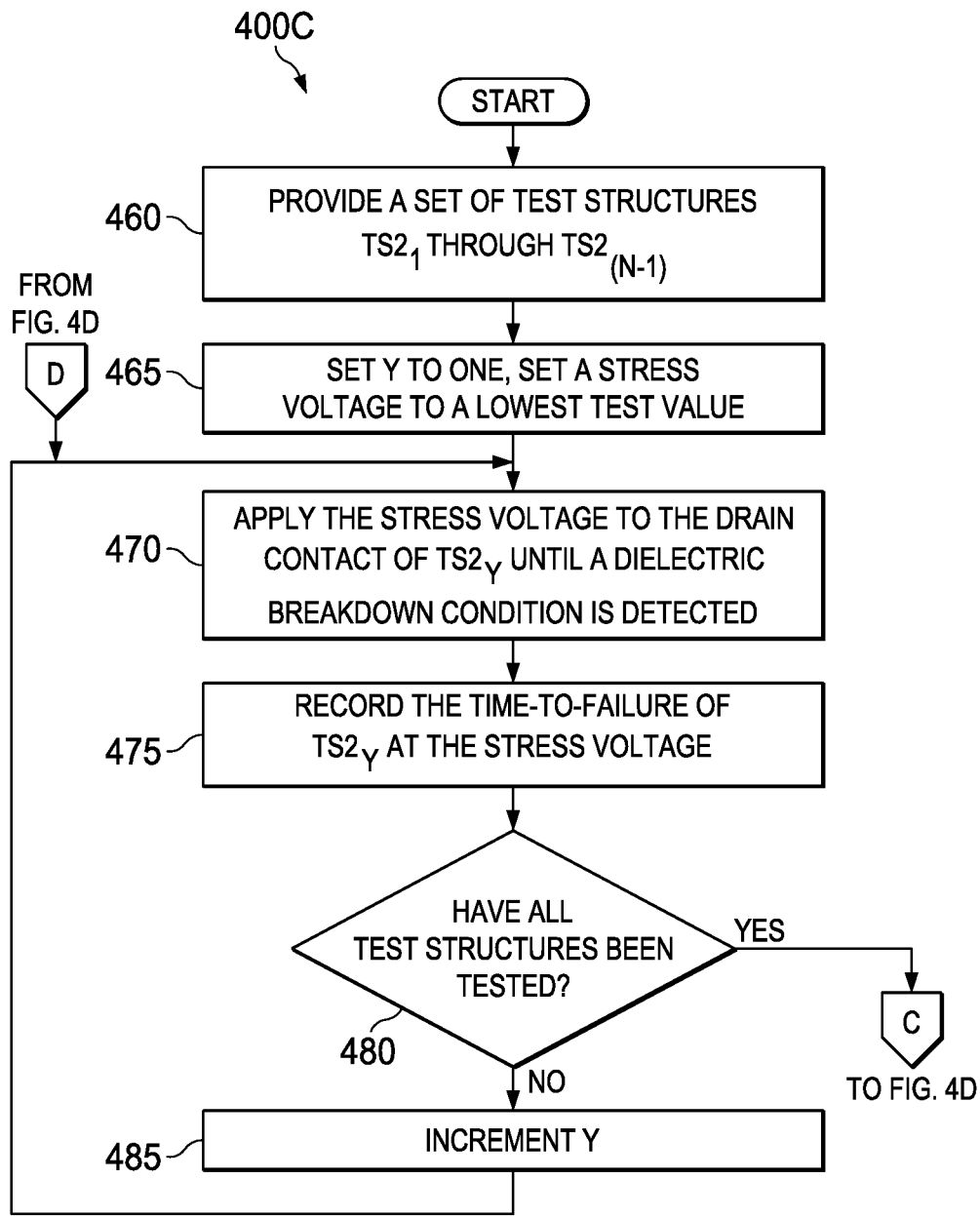
FIGS. 4C and 4D depict a further method of testing specific field plates of a GaN or semiconductor device having multiple field plates according to an embodiment of the disclosure.
Figure 4D:
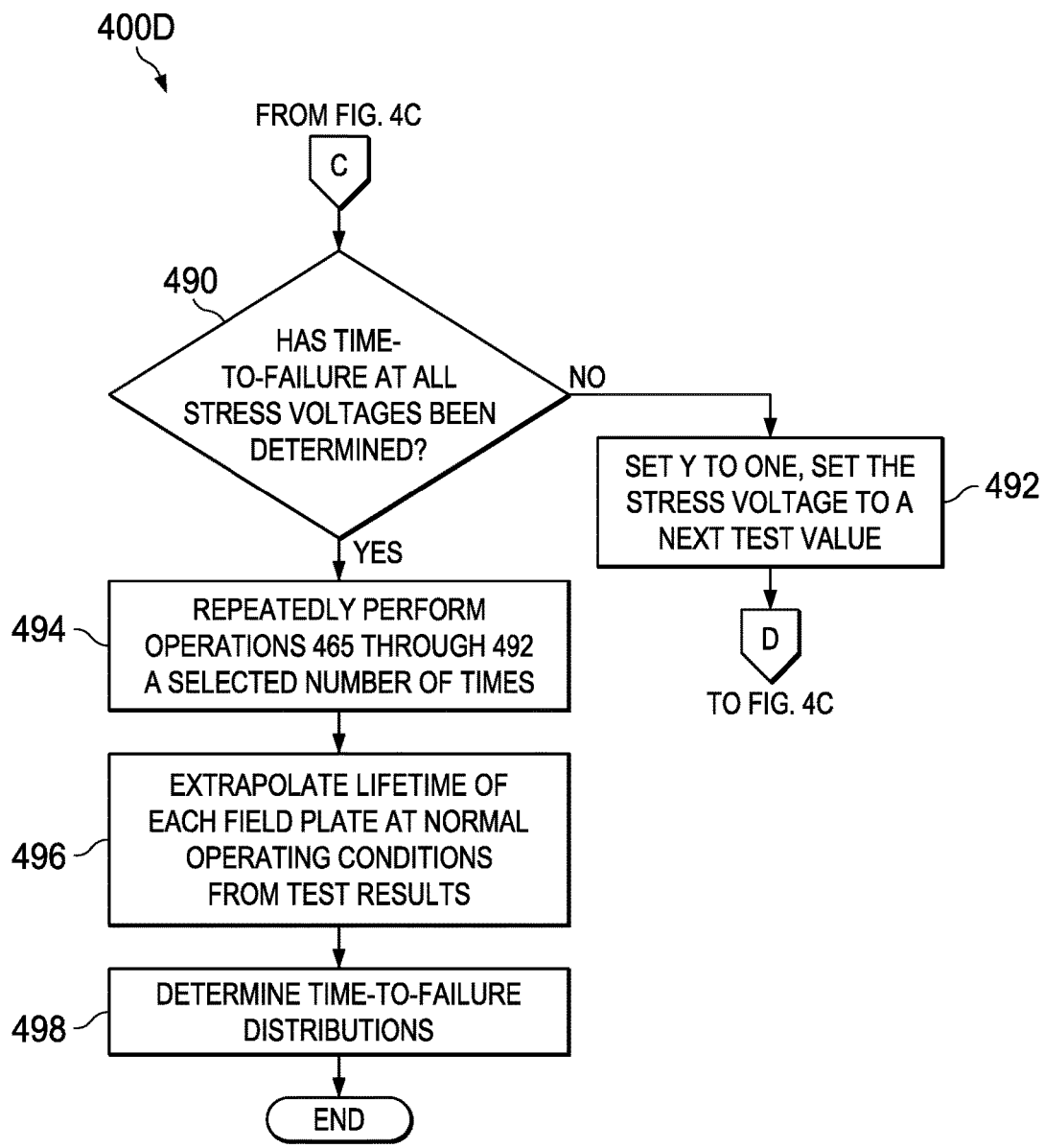

The disclosed structures and process provide valuable information to assist in proper design of a GaN device. However, both the structures and the process can also be utilized to ensure that processing of the wafers during production remain within specification. In order to do so, the test structures can be incorporated into the scribe structures adjacent the scribe lines for the wafer. FIG. 3A depicts an overhead view of a semiconductor wafer 300A that includes multiple dies 304 on which are formed a GaN device having multiple field plates. In one embodiment, the GaN device is a power transistor. The number of dies 304 can vary greatly depending upon the device geometry, the size of the wafer and other factors; the layout shown is only one possible example. The dies 304 may be virtually any type of integrated circuits, such as microprocessors, graphics processors, combined microprocessors and graphics processors, memory devices, application specific integrated circuits or virtually any other type of semiconductor based circuits. If implemented as processors of one sort or another, the dies 304 may be single or multicore. Four of the dies 304 are located in region 302, which is shown encircled by a dotted line. FIG. 3B depicts an enlargement of region 302 and the four included dies 304.

FIGS. 3A and 3B depict the semiconductor wafer 300A from the circuitry side of the dies 304 and at a stage in processing just prior to die singulation. Thus, the surfaces that are visible in FIGS. 3A and 3B consist of inter-level dielectric materials and scribe lines as described more fully below. The portions of the wafer 300A that consist of semiconductor materials are generally beneath those portions that are visible in FIGS. 3A and 3B. In enlargement 300B, dies 304 are shown to be separated by dicing alleys 306 that run between the separate dies 304; dies 304 will be singulated from the wafer 300A generally along the dicing alleys 306. The singulation may be carried out by a variety of techniques, such as sawing, laser cutting, combinations of these with or without breaking or the like. Whether by saw, laser or the like, the singulation process places great stresses on the perimeter of the die.

Between dicing alleys 306, each die 304 includes an active circuitry region 308 that is surrounded by a scribe structure 310. The active circuitry region 308 performs the work for which the die was manufactured and includes a number of input/output (I/O) pads 312 that may be bump pads, wire bond pads or other type of I/O pads as desired. Beneath the I/O pads 312 but not visible in FIG. 3B, is a series of stacked interconnect layers leading down to device circuitry, such as the source contact, drain contact and gate of a transistor. While only a few I/O pads 312 are depicted for simplicity of illustration, the skilled artisan will appreciate that there may be thousands of such pads. The I/O pads 312 are surrounded laterally by inter-level dielectric material 314. The scribe structure 310 is designed to act as both a crack stop and also as a protective structure to protect the active circuitry region 308 during subsequent singulation, as well as providing a region where test structures can be incorporated for ease of testing after a production run.

FIG. 3C depicts a cross-section of a scribe structure taken along the line A-A' according to an embodiment of the disclosure. Scribe structure 300C includes test structures $TS_0$ through $TS_3$, such that a test structure is available for testing gate 320 and for testing each of field plates 322, 324, 326. Test structure $TS_3$ includes source contact 316, drain contact 318, gate 320, and field plates 322-326. Isolation structures 330 separate the various test structures from each other to prevent electrical interference between the test structures. In the embodiment shown, isolation structures 330 are trench isolation, although isolation implantation can also be used for isolation. Test structure $TS_0$ can be utilized to test gate 320; test structure $TS_1$ can be utilized to test field plate 322; test structure $TS_2$ can be utilized to test field plate 324; and test structure $TS_3$ can be utilized to test field plate 326. Although not specifically illustrated in FIG. 3C, source contact 316, gate 320 and drain contact 318 of each of test structures $TS_0$, $TS_1$, $TS_2$, $TS_3$ are coupled to a respective I/O pad 312 as shown in FIG. 3B. Accordingly, appropriate voltages can be applied to the I/O pads 312 that correspond to source contact 316, gate 320 and drain contact 318 of each of test structures $TS_0$, $TS_1$, $TS_2$, $TS_3$, $TS2_1$, $TS2_2$.

Similarly, FIG. 3D depicts a cross-section of another scribe structure taken along the line A-A' according to an embodiment of the disclosure. Scribe structure 300D includes test structures $TS2_1$ through $TS2_2$, such that a test structure is available for testing each of inner field plates 322, 324. Test structure $TS2_2$ includes source contact 316, drain contact 318, and field plate 324 and test structure $TS2_1$ includes source contact 316, drain contact 318, and field plate 322. Isolation structures 330 separate the various test structures from each other to prevent electrical interference between the test structures. Test structure $TS2_1$ can be utilized to test field plate 322 and test structure $TS2_2$ can be utilized to test field plate 324. Using the method described below in FIG. 4, each of test structures $TS_0$, $TS_1$, $TS_2$, $TS_3$, $TS2_1$, $TS2_2$ can be tested at the wafer level prior to singulation and/or after singulation.

FIGS. 4A-D depict an overall test method for testing a gallium nitride (GaN) transistor or other semiconductor device that comprises N field plates, N being an integer, X being an integer between 0 and N inclusive, and Y being an integer between 1 and (N−1) inclusive. Test method 400A includes providing (405) a set of test structures $TS_0$ through $TS_N$. A test structure $TS_X$ of the set of test structures includes a GaN substrate, a dielectric material overlying the GaN substrate, a source contact abutting the GaN substrate, a drain contact abutting the GaN substrate, a gate overlying the substrate and lying between the source contact and the drain contact, and X field plates corresponding to X of the N field plates of the GaN transistor that are nearest to the GaN substrate.

The test method includes setting (410) X to zero and setting a stress voltage to a lowest test value. The stress voltage is applied (415) to the drain contact of $TS_X$ until a dielectric breakdown condition is detected, i.e., by determining that the gate/drain leakage has abruptly increased. In at least one embodiment, the stress voltage is applied while holding the source contact at a lower rail and holding the gate voltage below the threshold voltage. The time-to-failure of $TS_X$ at the stress voltage is recorded (420). A determination is then made (425) whether all test structures have been tested, i.e., whether X is equal to N. If all of the test structures have not been tested, then X is incremented (430) and the method returns to point A to continue the testing by applying the stress voltage to the next test structure. If all of the test structures have been tested and the test structures were formed in the scribe structure of a production chip, testing at a single voltage can indicate whether any drift in the lifetime of the structure at the given voltage has occurred. However, if the testing is being performed in order to verify the design and extrapolate the lifetime of the device, the testing continues at point B to test at other voltages. Testing of multiple voltages on a production chip can be used to determine whether there is drift in the voltage acceleration factor.

At point B in method 400B, a determination is made (435) whether the time-to-failure has been determined at all stress voltages. If this has not occurred, X is set (440) to zero again and the stress voltage is set to a next test value, then the method returns to point A to apply the new test voltage. It will be understood that since the device is tested to failure, each new test voltage will be applied to a new set of test structures. If the time-to-failure has been determined for all test voltages, the entire testing operation, i.e., operations 410 through 440 can be repeated (445) a selected number of times in order to obtain average values of the time-to-failure. The number of times the entire operation is performed can be part of the design of the testing protocol. Once all testing has been completed, the lifetime of the device at normal operating conditions can be extrapolated (450) from the test results. Additionally, the obtained test results can also be used to determine (455) the time-to-failure distributions, which can provide additional information regarding reliability.

Test methods 400C and 400D perform the same operations on the second set of test structures. Method 400C includes providing (460) a set of test structures $TS2_1$ through $TS2_{(N-1)}$. A test structure $TS2_Y$ of the second set of test structures includes a GaN substrate, a dielectric material overlying the GaN substrate, a source contact abutting the GaN substrate, a drain contact abutting the GaN substrate, and a $Y^{th}$ field plate corresponding to the $Y^{th}$ of the N field plates of the GaN transistor. As noted previously, the $Y^{th}$ field plate will act as the gate for the $TS2_Y$ structure.

The test method includes setting (465) Y to one and setting a stress voltage to a lowest test value. The stress voltage is applied (470) to the drain contact of $TS2_Y$ until a dielectric breakdown condition is detected. In at least one embodiment, the stress voltage is applied while holding the source contact at a lower rail and holding the gate voltage below the threshold voltage. In one embodiment, the stress voltage is applied while allowing the source contact to float or be disconnected. The time-to-failure of $TS2_Y$ at the stress voltage is recorded (475). A determination is then made (480) whether all test structures have been tested, i.e., whether Y is equal to (N−1). If all of the test structures have not been tested, then Y is incremented (485) and the method returns to point C to continue the testing by applying the stress voltage to the next test structure. Otherwise, the testing continues at point D in method 400D to test at other voltages.

At point D, a determination is made (490) whether the time-to-failure has been determined at all stress voltages. If this has not occurred, Y is set (492) to one again and the stress voltage is set to a next test value, then the method returns to point C to apply the new test voltage. Again, each new test voltage will be applied to a new set of test structures. If the time-to-failure has been determined for all test voltages, the entire testing operation, i.e., operations 465 through 492 can be repeated (494) a selected number of times in order to obtain average values of the time-to-failure, which can be part of the design of the testing protocol. Once all testing has been completed, the lifetime of the specific field plates at normal operating conditions can be extrapolated (4496) from the test results. Additionally, the obtained test results can also be used to determine (498) the time-to-failure distributions, which can provide additional information regarding reliability.

Applicants have disclosed a set of test structures and a method of utilizing the set of test structures to validate an expected lifetime of a GaN device that uses a plurality of field plates. Successive test structures in the set of test structures remove one or more of the outermost field plates in order to test the remaining structures. The disclosed structures and methods can be utilized both in testing and validating a new design and in monitoring a production process to ensure that the quality of the processing and the GaN device remains at the design level.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A test method for testing a Gallium-Nitride (GaN) device, comprising:
    providing a first set of (N+1) test structures that comprises N field plates, N being an integer and X being an integer between 0 and N inclusive, each test structure $TS_X$ of the first set of test structures comprising:
        a GaN substrate;
        a dielectric material overlying the GaN substrate;
        a respective source contact abutting the GaN substrate;
        a respective drain contact abutting the GaN substrate;
        a respective gate overlying the substrate and lying between the respective source contact and the respective drain contact; and
        X respective field plates corresponding to X of the N field plates of the GaN transistor, the X field plates comprising field plates that are nearest to the GaN substrate; and
    for each test structure $TS_X$, applying a stress voltage to the drain contact of test structure $TS_X$ until a dielectric breakdown condition is detected and recording the time-to-failure of test structure $TS_X$ at the stress voltage.

2. The test method of claim 1, wherein first set of (N+1) test structures further comprises a respective input/output pad coupled to each of the respective source contact, the respective drain contact and the respective gate of each test structure.

3. The test method of claim 2, wherein first set of (N+1) test structures comprises an epitaxial layer formed in the GaN substrate.

4. The test method of claim 3, wherein a first field plate of the N field plates is electrically coupled to the gate and extends laterally beyond the gate towards the drain contact.

5. The test method of claim 4, wherein a second field plate of the N field plates is electrically coupled to a first structure selected from a group consisting of the gate and the source contact and extends laterally beyond the first field plate towards the drain contact.

6. The test method of claim 5, wherein a third field plate of the N field plates is electrically coupled to a second structure selected from a group consisting of the gate and the source contact and extends laterally beyond the second field plate towards the drain contact.

7. The test method of claim 4, wherein first set of (N+1) test structures further comprises respective isolation structures separating each respective pair of adjacent test structures.

8. The test method of claim 7, wherein the respective isolation structures are trench isolation.

9. The test method of claim 7, wherein the respective isolation structures are isolation implantations.

10. The test method of claim 7, wherein the respective gate further overlies at least a portion of the dielectric material.

11. The test method of claim 10, further comprising:
    providing a second set of (N−1) test structures with Y being an integer between 1 and (N−1) inclusive, a test structure $TS_Y$ of the second set of (N−1) test structures comprising:
        a respective source contact abutting the GaN substrate;

a respective drain contact abutting the GaN substrate; and
a respective field plate corresponding to the $Y^{th}$ field plate of the GaN transistor;
for each test structure $TS_Y$, the test method comprising:
applying a stress voltage to the drain contact of $TS_Y$ until a dielectric breakdown condition is detected; and
recording the time-to-failure of $TS_Y$ at the stress voltage.

12. The test method of claim 1, further comprising providing a second set of (N−1) test structures with Y being an integer between 1 and (N−1) inclusive, each test structure TSy of the second set of (N−1) test structures comprising:
a respective source contact abutting the GaN substrate;
a respective drain contact abutting the GaN substrate; and
a respective field plate corresponding to the $Y^{th}$ field plate of the GaN transistor.

13. A test method comprising:
providing a first set of test structures $TS_0$ through $TS_N$ for a gallium nitride (GaN) transistor that comprises N field plates, N being an integer and X being an integer between 0 and N inclusive, each test structure $TS_X$ of the first set of test structures comprising:
a GaN substrate,
a dielectric material overlying the GaN substrate,
a respective source contact abutting the GaN substrate,
a respective drain contact abutting the GaN substrate,
a respective gate overlying the substrate and lying between the source contact and the drain contact,
X respective field plates corresponding to X field plates of the N field plates of the GaN transistor that are nearest to the GaN substrate, and
a respective input/output pad coupled to each of the respective source contact, the respective drain contact and the respective gate;
for each test structure $TS_X$, the test method comprising:
applying a stress voltage to the drain contact of test structure $TS_X$ until a dielectric breakdown condition is detected; and
recording the time-to-failure of test structure $TS_X$ at the stress voltage.

14. The test method of claim 13, wherein the first set of test structures are provided in a scribe structure and the test method further comprises determining whether there is in a determined lifetime of the GaN transistor at the stress voltage.

15. The test method of claim 13, further comprising:
incrementing the stress voltage;
performing the applying, recording and incrementing a selected number of times, each of the selected number of times being performed on a new first set of test structures; and
using a plurality of the recorded times-to-failure of the test structure to extrapolate a mean time-to-failure at normal operating voltages.

16. The test method of claim 15, further comprising using the plurality of the recorded times-to-failure of the test structure to determine a time-to-failure distribution.

17. The test method of claim 13, further comprising:
incrementing the stress voltage;
performing the applying, recording and incrementing a selected number of times, each of the selected number of times being performed on a new first set of test structures; and
determining whether there has been a drift in a voltage acceleration factor.

18. The test method of claim 13, further comprising holding the gate at a voltage that is lower than the threshold voltage of the GaN transistor.

19. The test method of claim 13, further comprising holding the source contact at a lower rail.

20. The test method of claim 13, wherein the stress voltage is in the range of approximately three to six times the normal operating voltage.

* * * * *